(12) United States Patent
Chang et al.

(10) Patent No.: US 12,107,078 B2
(45) Date of Patent: Oct. 1, 2024

(54) SEMICONDUCTOR DIE INCLUDING FUSE STRUCTURE AND METHODS FOR FORMING THE SAME

(71) Applicant: Taiwan Semiconductor Manufacturing Company Limited, Hsinchu (TW)

(72) Inventors: Jen-Yuan Chang, Hsinchu (TW); Chia-Ping Lai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/229,627

(22) Filed: Aug. 2, 2023

(65) Prior Publication Data

US 2023/0378136 A1   Nov. 23, 2023

Related U.S. Application Data

(62) Division of application No. 17/472,115, filed on Sep. 10, 2021, now Pat. No. 11,862,609.

(60) Provisional application No. 63/162,969, filed on Mar. 18, 2021.

(51) Int. Cl.
| | |
|---|---|
| H01L 21/00 | (2006.01) |
| H01L 21/768 | (2006.01) |
| H01L 23/48 | (2006.01) |
| H01L 23/522 | (2006.01) |
| H01L 23/525 | (2006.01) |
| H01L 25/065 | (2023.01) |

(52) U.S. Cl.
CPC .... *H01L 25/0657* (2013.01); *H01L 21/76898* (2013.01); *H01L 23/481* (2013.01); *H01L 23/5226* (2013.01); *H01L 23/5256* (2013.01); *H01L 2225/06541* (2013.01)

(58) Field of Classification Search
CPC .......... H01L 25/0657; H01L 21/76898; H01L 23/481; H01L 23/5226
See application file for complete search history.

(56) References Cited

U.S. PATENT DOCUMENTS

| | | | | |
|---|---|---|---|---|
| 9,257,392 | B2* | 2/2016 | Yang | H01L 29/0649 |
| 10,229,897 | B2* | 3/2019 | Das | H01L 21/187 |
| 10,418,350 | B2* | 9/2019 | Das | H01L 25/50 |
| 10,504,873 | B1* | 12/2019 | Chen | H01L 23/5226 |
| 10,867,968 | B2* | 12/2020 | Chen | H01L 21/56 |
| 10,910,364 | B2* | 2/2021 | Or-Bach | H10B 41/20 |
| 11,437,332 | B2* | 9/2022 | Chang | H01L 24/27 |
| 11,862,609 | B2* | 1/2024 | Chang | H01L 25/0652 |

(Continued)

FOREIGN PATENT DOCUMENTS

| | | | | |
|---|---|---|---|---|
| CN | 101295653 A | * | 10/2008 | ......... H01L 21/2007 |
| CN | 101673738 A | * | 3/2010 | ..... H01L 21/823878 |

(Continued)

*Primary Examiner* — Laura M Menz

(74) *Attorney, Agent, or Firm* — The Marbury Law Group, PLLC

(57) ABSTRACT

A semiconductor die includes a first semiconductor substrate; a first interconnect structure disposed on a front side of the first semiconductor substrate; a first through-substrate via (TSV) structure extending through the first semiconductor substrate; and a first fuse structure disposed between and electrically connecting the TSV structure and the first interconnect structure.

20 Claims, 8 Drawing Sheets

(56) References Cited

U.S. PATENT DOCUMENTS

| | | | |
|---|---|---|---|
| 2019/0393194 A1* | 12/2019 | Chen | H01L 24/92 |
| 2020/0098731 A1* | 3/2020 | Chen | H01L 23/481 |
| 2022/0139851 A1* | 5/2022 | Chang | H01L 25/0657 |
| | | | 257/734 |
| 2022/0262695 A1* | 8/2022 | Chang | H01L 21/568 |
| 2022/0301981 A1* | 9/2022 | Chang | H01L 24/19 |
| 2022/0302085 A1* | 9/2022 | Chang | H01L 23/481 |
| 2022/0310570 A1* | 9/2022 | Chang | H01L 25/105 |
| 2022/0367392 A1* | 11/2022 | Chang | H01L 24/80 |
| 2023/0060208 A1* | 3/2023 | Chang | H01L 24/13 |
| 2023/0067714 A1* | 3/2023 | Chang | H01L 23/60 |
| 2023/0069315 A1* | 3/2023 | Chang | H01L 28/90 |
| 2023/0073026 A1* | 3/2023 | Elsherbini | H01L 25/0652 |
| 2023/0378136 A1* | 11/2023 | Chang | H01L 25/50 |

FOREIGN PATENT DOCUMENTS

| | | | | | |
|---|---|---|---|---|---|
| CN | 101685799 | A | * | 3/2010 | H01L 21/2236 |
| CN | 101685799 | B | * | 2/2012 | H01L 21/2236 |
| CN | 101673738 | B | * | 9/2012 | H01L 21/823878 |
| CN | 106206567 | A | * | 12/2016 | H01L 21/31144 |
| CN | 104051422 | B | * | 1/2018 | A61N 1/3931 |
| CN | 114709179 | A | * | 7/2022 | H01L 21/568 |
| CN | 114765153 | A | * | 7/2022 | H01L 21/76898 |
| CN | 114783957 | A | * | 7/2022 | H01L 25/105 |
| CN | 114823620 | A | * | 7/2022 | H01L 21/76898 |
| CN | 115527985 | A | * | 12/2022 | H01L 23/10 |
| CN | 115527987 | A | * | 12/2022 | H01L 21/76898 |
| CN | 115527990 | A | * | 12/2022 | H01L 22/32 |
| CN | 115528007 | A | * | 12/2022 | H01L 21/56 |
| CN | 115528008 | A | * | 12/2022 | H01L 23/481 |

* cited by examiner

SEMICONDUCTOR DIE INCLUDING FUSE STRUCTURE AND METHODS FOR FORMING THE SAME

RELATED APPLICATIONS

This application is a divisional application of U.S. patent application Ser. No. 17/472,115, entitled "Semiconductor Die Including Fuse Structure and Method for Forming the Same", filed Sep. 10, 2021, which claims priority to U.S. Provisional Patent Application No. 63/162,969 entitled "New Structure for Silicon on Integrated Circuit Backside Through Semiconductor Via Fuse" filed on Mar. 18, 2021, the entire contents of which are hereby incorporated by reference for all purposes.

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
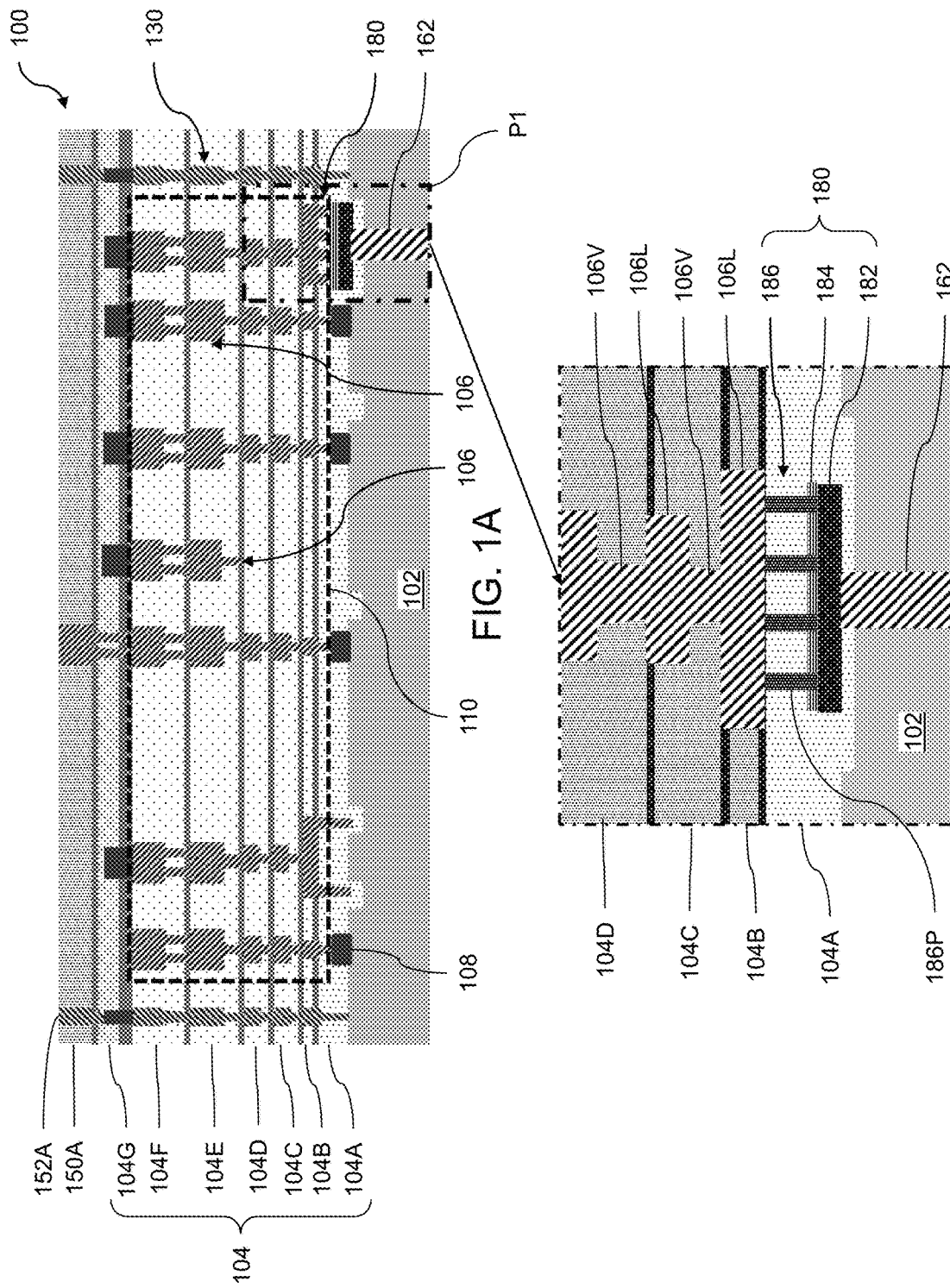
FIG. 1A is a vertical cross-sectional view of a semiconductor die 100, according to various embodiments of the present disclosure.
FIG. 1B shows an enlarged portion of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

In semiconductor packages, upper and lower dies may be connected with a connection circuit that includes a through-silicon via (TSV) structure. A conventional TSV structure may typically involve forming a trench in a semiconductor substrate, forming a liner over the walls of the trench, and subsequently filling the lined trench with a conductive metal, for example, entirely with copper (Cu). Other device structures such as fuses, anti-fuses, resistors, and capacitors are conventionally located distal to the formed TSV. For example, such device structures may be formed in a back-end-of-the-line (BEOL) region of the die, such as in an interconnect structure.

After electrical testing, a fuse structure may be used to interrupt current flow through the connection circuit. The fuse structure may electrically disconnect a defective die and/or according to customer needs. A conventional fuse structure may be electrically connected to an interconnect structure and may be located some distance from a TSV structure. As a result of the distal location of the fuse structure, current may still be provided to at least a portion of the interconnect structure and/or other device structures, resulting in unnecessary power consumption.

The present disclosure is directed to semiconductor devices, and specifically to semiconductor packages and dies that include a fuse structure configured to break a connection circuit, at a contact point between a TSV and an interconnect structure. As such, unnecessary power consumption may be prevented in a disconnected die.

FIG. 1A is a vertical cross-sectional view of a first semiconductor die 100, according to various embodiments of the present disclosure. FIG. 1B is an enlarged view of a portion P1 of FIG. 1A.

Referring to FIGS. 1A and 1B, the first die 100 may be, for example, an application-specific integrated circuit (ASIC) chip, an analog chip, a sensor chip, a wireless and radio frequency chip, a voltage regulator chip or a memory chip. In some embodiments, the first die 100 may be an active component or a passive component. In some embodiments, the first die 100 includes a first semiconductor substrate 102, a first dielectric structure 104, a first interconnect structure 110 embedded within the first dielectric structure 104, a first seal ring 130, a first TSV structure 162, and a first fuse structure 180.

In some embodiments, the first semiconductor substrate 102 may include an elementary semiconductor such as silicon or germanium and/or a compound semiconductor such as silicon germanium, silicon carbide, gallium arsenic, indium arsenide, gallium nitride or indium phosphide. In some embodiments, the first semiconductor substrate 102 may be a semiconductor-on-insulator (SOI) substrate. In various embodiments, the first semiconductor substrate 102 may take the form of a planar substrate, a substrate with multiple fins, nanowires, or other forms known to people having ordinary skill in the art. Depending on the requirements of design, the first semiconductor substrate 102 may be a P-type substrate or an N-type substrate and may have doped regions therein. The doped regions may be configured for an N-type device or a P-type device.

In some embodiments, the first semiconductor substrate 102 includes isolation structures defining at least one active area, and a first device layer may be disposed on/in the active area. The first device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the first device layer includes a gate structure, source/drain regions, spacers, and the like.

The first dielectric structure 104 may be disposed on a front side of the first semiconductor substrate 102. In some embodiments, the first dielectric structure 104 may include silicon oxide, silicon oxynitride, silicon nitride, a low dielectric constant (low-k) material, or a combination thereof. Other suitable dielectric materials may be within the contemplated scope of disclosure. The first dielectric structure 104 may be a single layer or a multiple-layer dielectric structure. For example, as shown in FIG. 1B, the first dielectric structure 104 may include multiple dielectric layers 104A-104F, which may include a substrate oxide layer 104A, inter-layer dielectric (ILD) layers 104B-104F, and a passivation layer 104G. However, while FIG. 1B illustrates seven dielectric layers, the various embodiments of the present disclosure are not limited to any particular number of layers. Fewer or additional dielectric layers may be included in the first dielectric structure 104.

The first dielectric structure 104 may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

A first interconnect structure 110 may be formed in the first dielectric structure 104. The first interconnect structure 110 may include first metal features 106 disposed in the first dielectric structure 104. The first metal features 106 may be any of a variety of metal lines and via structures that electrically connect the metal lines of adjacent ILD layers 104B-104F. The first metal features 106 may be electrically connected to substrate electrodes 108 disposed on the first semiconductor substrate 102, such that the first interconnect structure 110 may electrically interconnect semiconductor devices formed on the first semiconductor substrate 102. In some embodiments, the substrate electrodes 108 may include metal gates of transistors formed in the device layer of the first semiconductor substrate 102.

The interconnect structure 110 may be formed of any suitable electrically conductive material, such as copper (Cu), a copper alloy, aluminum (Al), an aluminum alloy, silver (Ag), combinations thereof, or the like. For example, the interconnect structure 110 may preferably include copper at an atomic percentage greater than 80%, such as greater than 90% and/or greater than 95%, although greater or lesser percentages of copper may be used. Other suitable electrically conductive materials are within the contemplated scope of disclosure.

In some embodiments, barrier layers (not shown) may be disposed between the first metal features 106 and the dielectric layers of first dielectric structure 104, to prevent the material of the first metal features 106 from migrating to the first semiconductor substrate 102. The barrier layer may include Ta, TaN, Ti, TiN, CoW, or combinations thereof, for example. Other suitable barrier layer materials may be within the contemplated scope of disclosure.

The first seal ring 130 may extend around the periphery of the first die 100. For example, the first seal ring 130 may be disposed in the first dielectric structure 104 and may laterally surround the interconnect structure 110. The first seal ring 130 may be configured to protect the interconnect structure 110 from contaminant diffusion and/or physical damage during device processing, such as plasma etching and/or deposition processes.

The first seal ring 130 may include copper at an atomic percentage greater than 80%, such as greater than 90% and/or greater than 95% although greater or lesser percentages may be used. The first seal ring 130 may include conductive lines and via structures that are connected to each other and may be formed simultaneously with the conductive lines 106L and via structures 106V of the first metal features 106 of the interconnect structure 110. The first seal ring 130 may be electrically isolated from the first metal features 106. Other suitable first seal ring materials may be within the contemplated scope of disclosure.

In some embodiments, the first metal features 106 and/or the first seal ring 130 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the first metal features 106 and/or the first seal ring 130 may be formed by an electroplating process.

For example, the Damascene processes may include patterning the first dielectric structure 104 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the first dielectric structure 104.

In particular, the patterning, metal deposition, and planarizing processes may be performed for each of the ILD layers 104B-104F, in order to form the interconnect structure 110 and/or the first seal ring 130. For example, a first ILD layer 104B may be deposited and patterned to form openings in the ILD layer. A deposition process may then be performed to fill the openings in the ILD layer 104B. A planarization process may then be performed to remove the overburden and form metal features 106 in the ILD layer 104B. These process steps may be repeated to form the ILD layers 104C-104F and the corresponding metal features 106, and thereby complete the first interconnect structure 110 and/or first seal ring 130.

A first bonding layer 150A may be disposed over the first dielectric structure 104. The first bonding layer 150A may be formed of a dielectric material. One or more first die bonding pads 152A may be formed in the first bonding layer 150A. The first bonding layer 150A may be formed by depositing a dielectric material, such as silicon oxide, silicon nitride, a polymer, or a combination thereof, using any suitable deposition process. Other suitable dielectric materials may be within the contemplated scope of disclosure. The first die bonding pads 152A may be disposed in the first bonding layer 150A. The first die bonding pads 152A may be electrically conductive features formed of the same materials as the first metal features 106. For example, the first die bonding pads 152A may include tungsten (W), copper (Cu), a copper alloy, aluminum (Al), an aluminum alloy, or a combination thereof, or the like.

The first die bonding pads 152A may be formed in the first bonding layer 150A by a dual-Damascene processes, or by one or more single-Damascene processes, as described above. In alternative embodiments, the first die bonding pads 152A may be formed by an electroplating process.

The first TSV structure 162 may extend through a trench formed in the first semiconductor substrate 102. The first TSV structure 162 may be formed during a middle-end-of-line (MEOL) process, and may be formed of suitable electrically conductive material, such as, copper (Cu), a copper alloy, aluminum (Al), an aluminum alloy, silver (Ag), tungsten (W), combinations thereof, or the like. For example, the first TSV structure 162 may preferably include copper at an atomic percentage greater than 80%, such as greater than 90% and/or greater than 95%, although greater or lesser percentages of copper may be used.

In some embodiments, a barrier layer may be disposed between the first TSV structure 162 and the first semiconductor substrate 102 and the dielectric structure 104. The barrier layer may include Ta, TaN, Ti, TiN, CoW, or combinations thereof, for example. Other suitable barrier layer materials may be within the contemplated scope of disclosure.

The first fuse structure 180 may be disposed between the first TSV structure 162 and the interconnect structure 110. In particular, the first fuse structure 180 may be formed in the substrate oxide layer 104A. The first fuse structure 180 may include a resistance control layer 182, a contact etch stop layer (CESL) 184, and a contact structure 186.

The first TSV structure 162 may directly contact a first surface of the resistance control layer 182 that faces the first semiconductor substrate 102. The resistance control layer 182 may be formed of an electrically conductive material having a higher electrical resistance than the material(s) used to form the metal features 106 and/or TSV structure 162. In some embodiments, the resistance control layer 182 may have a higher electrical resistance than copper. For example, the resistance control layer 182 may be formed of materials such as SiGe, W, TiN, TaN, combinations thereof, or the like. In some embodiments, the resistance control layer 182 and the substrate electrodes 108 may be formed during the same process and/or of the same materials.

The CESL layer 184 may be formed of an etch-stop material such as silicon nitride, silicon carbide, silicon carbon nitride, combinations thereof, or the like. The CESL layer 184 may be formed as a single layer or multiple layers of the etch-stop material.

The contact structure 186 may directly contact a second surface of the resistance control layer 182 that is distal from the first semiconductor substrate 102. The contact structure 186 may be configured to electrically connect the resistance control layer 182 and/or the CESL layer 184 to a metal line 106L disposed in the ILD layer 104B. The contact structure 186 may be formed of a high melting point conductive material, such as tungsten or the like. Other suitable high melting point materials may be within the contemplated scope of disclosure.

The contact structure 186 may be formed of one or more pillars 186P that extend through the substrate oxide layer 104A and contact the second surface of the resistance control layer 182. For example, as shown in FIG. 1B, the contact structure may include four pillars 186P. However, the present disclosure is not limited to any particular number of pillars. For example, the contact structure 186 may include from 1 to 20 pillars 186P, in various embodiments.

An interface formed between the TSV structure 162 and the first surface of the resistance control layer 182 may have a first surface area. An interface formed between the contact structure 186 and the second surface of the resistance control layer 182 may have a second surface area. The first surface area may be greater than the second surface area. For example, the first surface area may be at least ten times greater than the second surface area.

Accordingly, the contact structure 186 may be configured to concentrate current flowing between the interconnect structure 110 and the first TSV structure 162 in the relatively small second surface region. As such, applying a higher voltage may generate localized heating sufficient to melt and/or vaporize the resistance control layer 182, thereby opening the first fuse structure 180 and electrically disconnect the interconnect structure 110 from the first TSV structure 162. In some embodiments, the heated resistance control layer material may migrate into adjacent layers of the first die 100, such that electrical contact between the contact structure 186 and the TSV structure 162 is broken.

Figure 2:
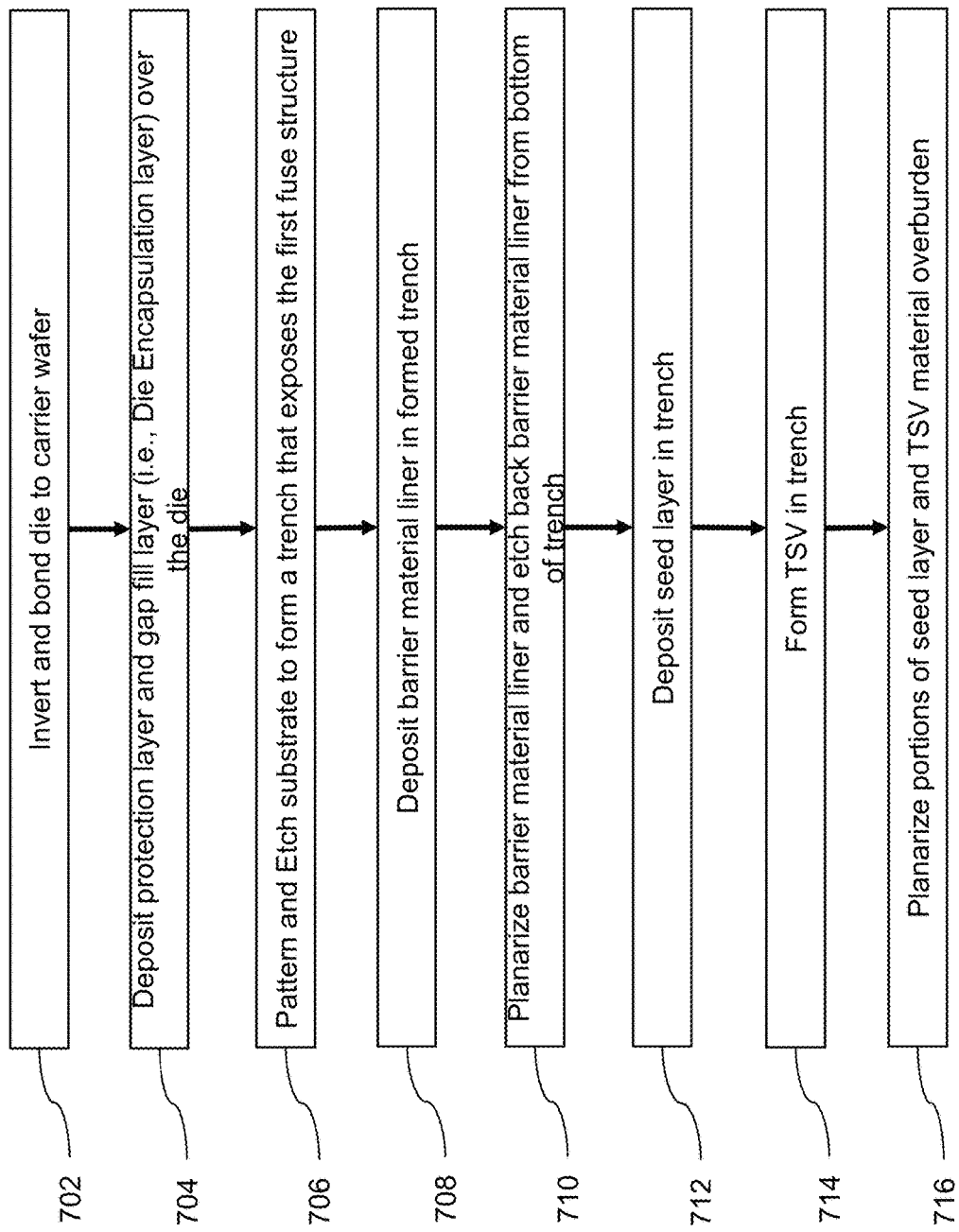
FIG. 2 is a flow chart showing the operations of a method of manufacturing a semiconductor die, according to various embodiments of the present disclosure.

FIG. 2 is a flow chart showing the operations of a method of forming a TSV 162 in a first die 100, according to various embodiments of the present disclosure. FIGS. 3A-3H are cross-sectional views showing operations of the method of FIG. 2, of which FIGS. 3C-3H are enlarged views of a portion P of FIG. 3B.

The first die 100 may be similar to the first die 100 shown in FIGS. 1A and 1B. For example, the first die 100 may include a first semiconductor substrate 102, a dielectric structure 104, an interconnect structure 110, a first bonding layer 150A, and a first fuse structure 180.

Figure 3A:
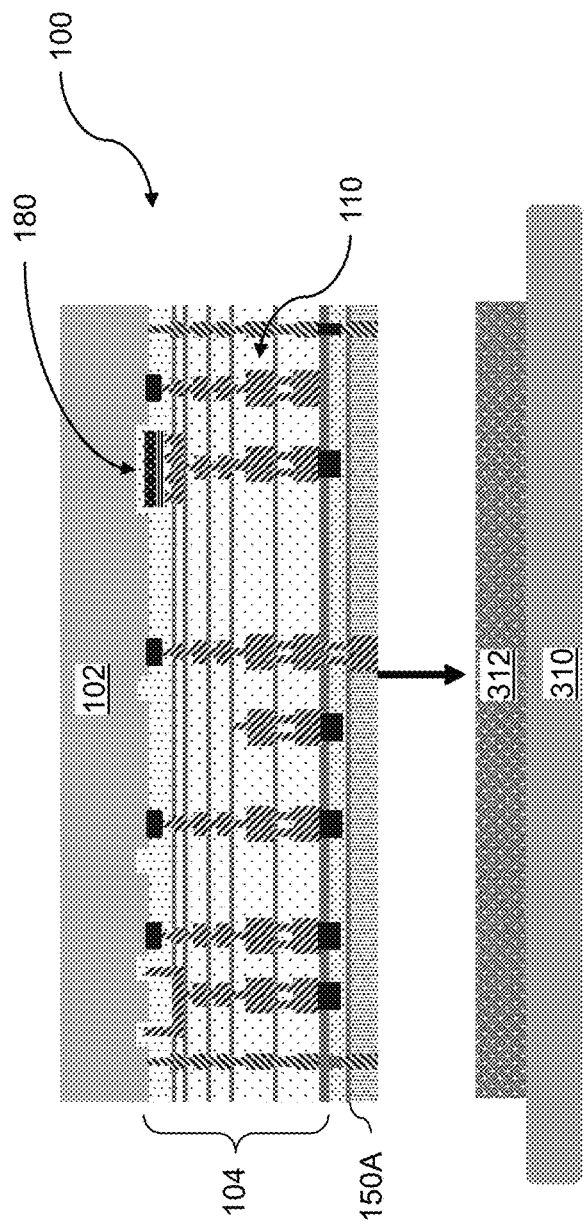
FIGS. 3A-3H are vertical cross-sectional views illustrating the intermediate structures that are formed as the operations of the method of FIG. 2 are performed.

Referring to FIGS. 2 and 3A, in operation 702 the first die 100 may be inverted and bonded to a carrier 310. In particular, the first bonding layer 150A may be bonded to a carrier bonding layer 312. The carrier 310 may be any suitable carrier substrate, such as a silicon wafer or a sapphire substrate. Other suitable carrier substrate materials are within the contemplated scope of disclosure.

Figure 3B:
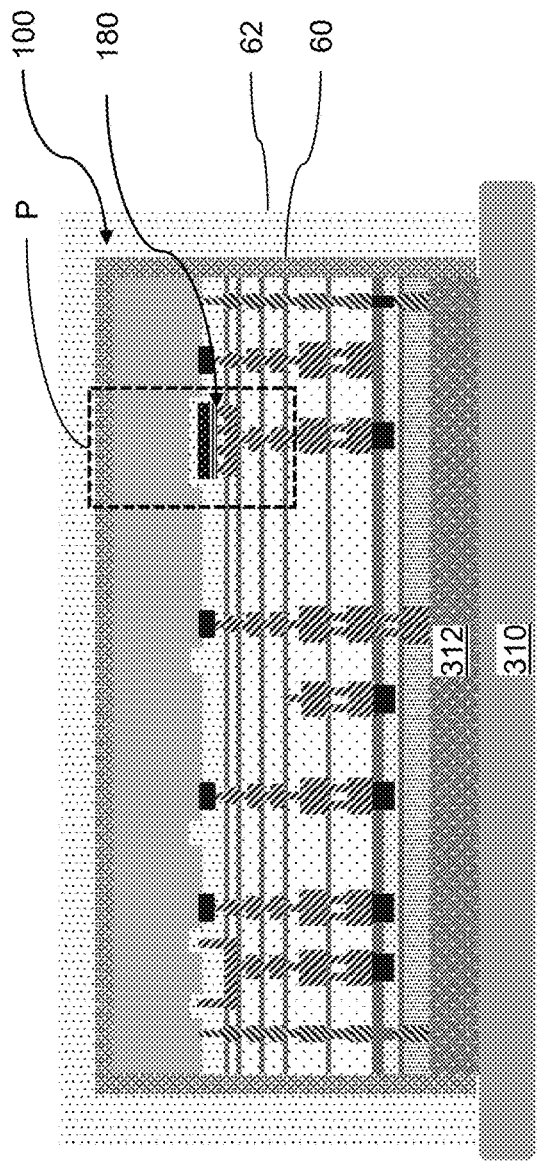

Referring to FIGS. 2 and 3B, in operation 704 a protection layer 60 may be deposited on the first die 100. A gap fill layer 62 may then be deposited on the protection layer 60. The protection layer 60 and/or the gap fill layer 62 may be formed of a dielectric material, such as silicon oxide, silicon oxynitride, silicon nitride, combinations thereof, or the like and may be deposited using any suitable deposition method. The protection layer 60 and gap fill layer 62 may form a die encapsulation layer.

Figure 3D:
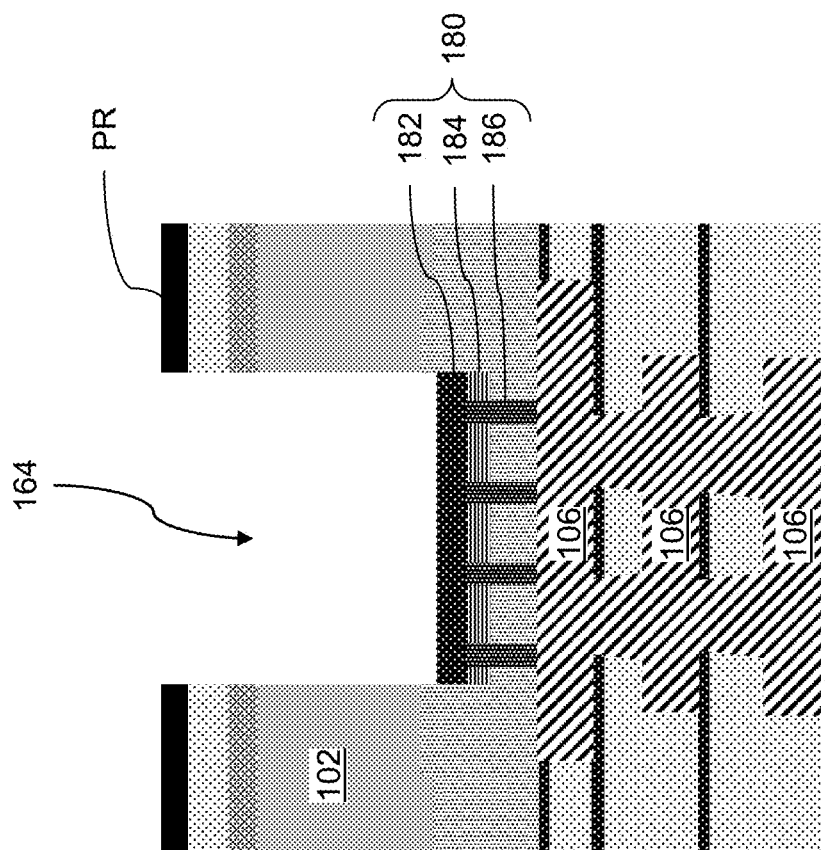
Figure 3C:
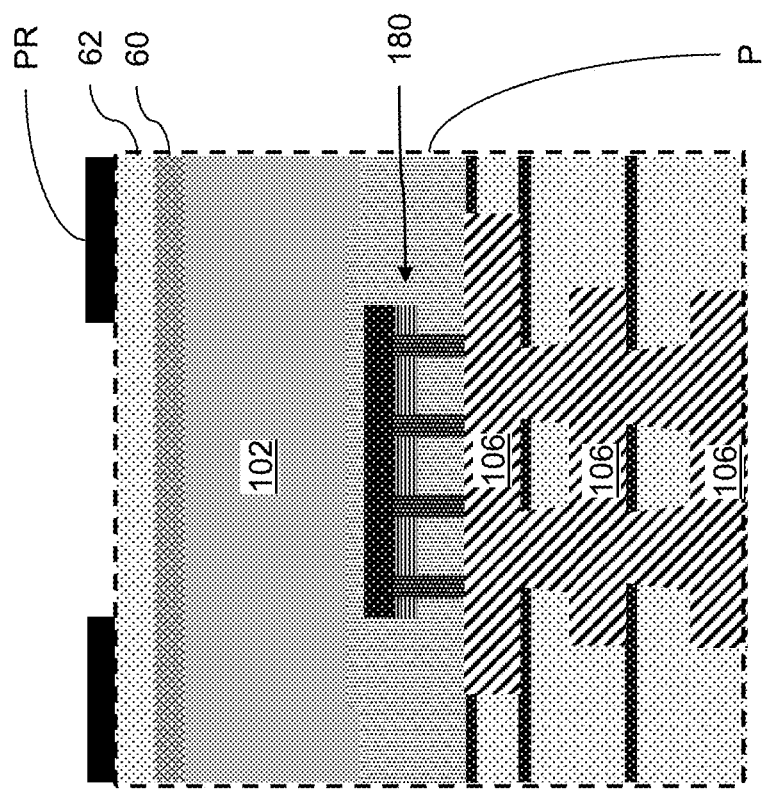

Referring to FIGS. 2 and 3C, in operation 706 a photoresist layer PR may be formed over the back side of the semiconductor substrate 102. For example, a photoresist material may be deposited on gap fill layer 62, exposed, and patterned to form the photoresist layer PR. The photoresist layer PR may have an opening that faces the first fuse structure 180.

Referring to FIGS. 2 and 3D, in addition as part of operation 706, a wet or dry etching process may then be performed, using the photoresist layer PR as a mask, to form a trench 164 that exposes the first fuse structure 180. In some embodiments, a first etching process may be performed to etch the first semiconductor substrate 102, and a second etching process may be performed to etch the substrate oxide layer 104A disposed over the first fuse structure 180. As such, the trench 164 may extend through the first semiconductor substrate 102 and the substrate oxide layer 104A. The photoresist layer PR may subsequently be removed by ashing or the like.

Figure 3F:
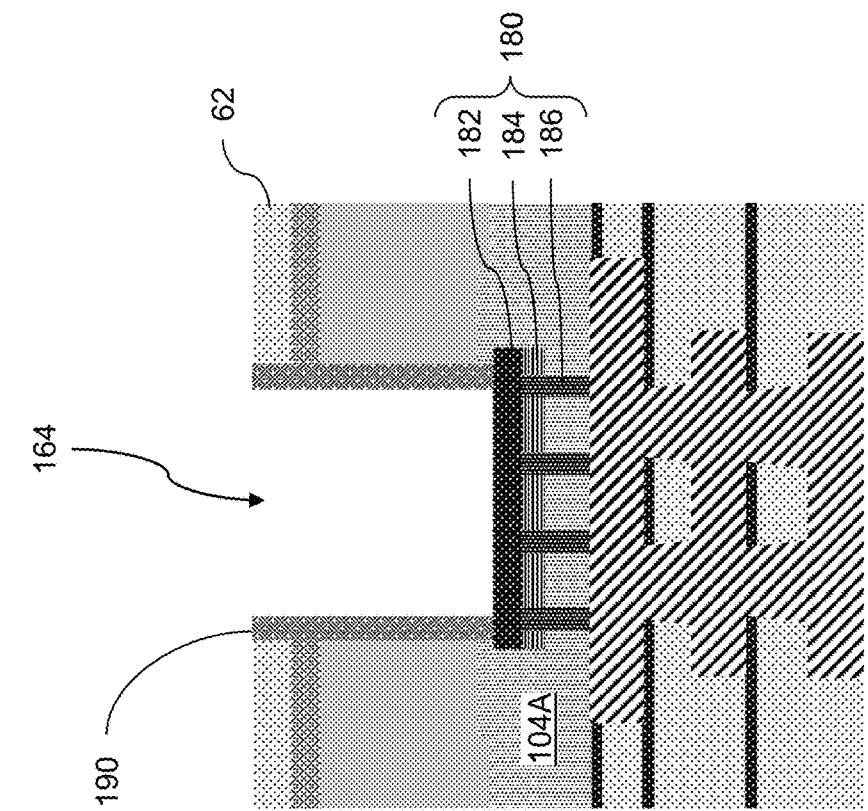
Figure 3E:
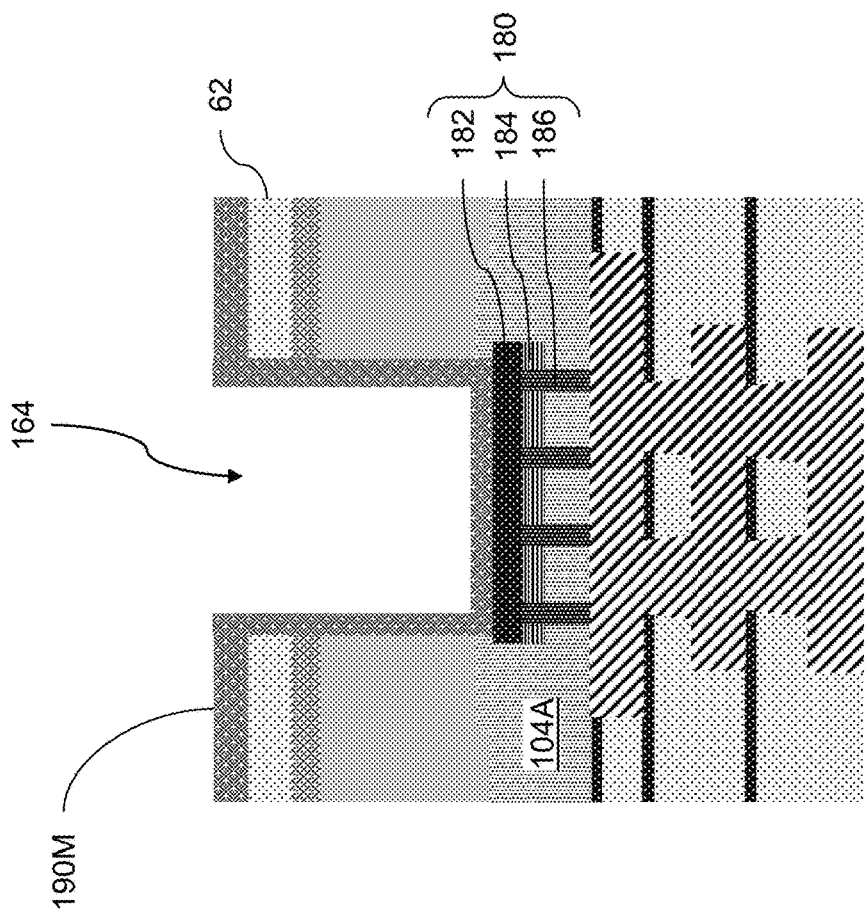

Referring to FIGS. 2 and 3E, in operation 708 a barrier material 190M may be deposited in the trench 164 and on the gap fill layer 62, using any suitable deposition process. In some embodiments, the barrier material 190M may include Ta, TaN, Ti, TiN, CoW, or combinations thereof, for example. Other suitable barrier materials may be within the contemplated scope of disclosure.

Referring to FIGS. 2 and 3F, in operation 710 an etch-back process may be performed to remove the barrier material 190M from the bottom of the trench and the upper surface of the gap-fill layer 62, to form a barrier layer 190. The etch-back process may also remove any portion of the substrate oxide layer 104A remaining on the first fuse structure 180. Any suitable etch-back process, such as reactive ion etching or the like, may be used.

Figure 3H:
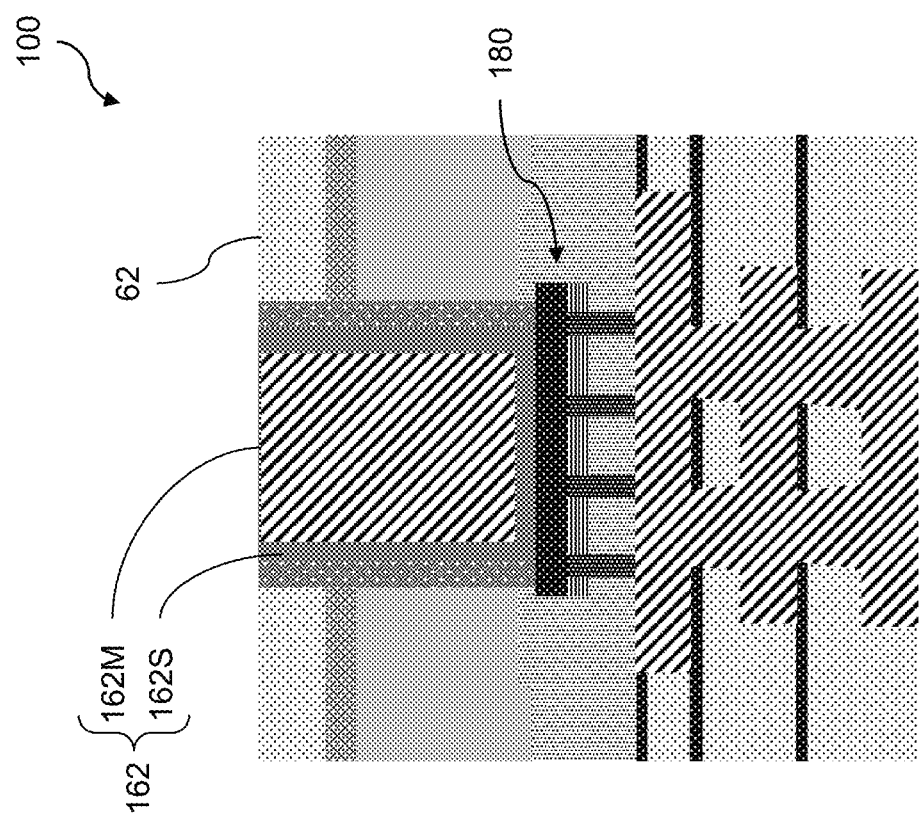
Figure 3G:
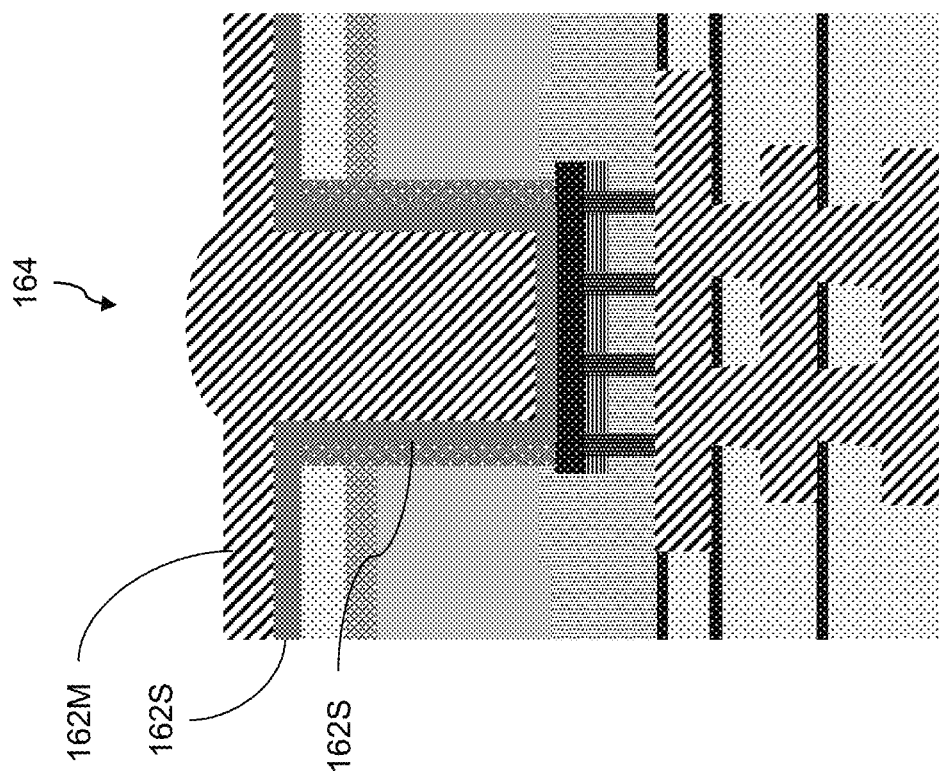

Referring to FIGS. 2 and 3G, in operation 712, a seed layer 162S may be deposited in the trench 164 and a TSV material layer 162M may be formed on the seed layer 162S. The seed layer 162S may be formed by electrodeposition of a seed material, such as Ti, TiN, Cu, alloys thereof, or the like, and may be formed by any suitable method, such as by electrodeposition or the like. In step 714, the TSV material layer 162M may be formed of a conductive material such as Cu, Au, Ag, alloys thereof, or the like, and may be grown on the seed layer 162S using an electrochemical plating process, or the like.

Referring to FIGS. 2 and 3H, in operation 716, a planarization process, such as chemical-mechanical planarization (CMP) may be performed to planarize the die 100. In particular, portions of the seed layer 162S and the TSV material layer 162M disposed outside of the trench 164 on the upper surface of the gap-fill layer 62 may be removed to form a first TSV structure 162. While the first TSV structure 162 is shown to include a distinct seed layer 162S and TSV metal layer 162M, such distinct layers may not be present, as the materials thereof may become inter-dispersed.

Figure 4A:
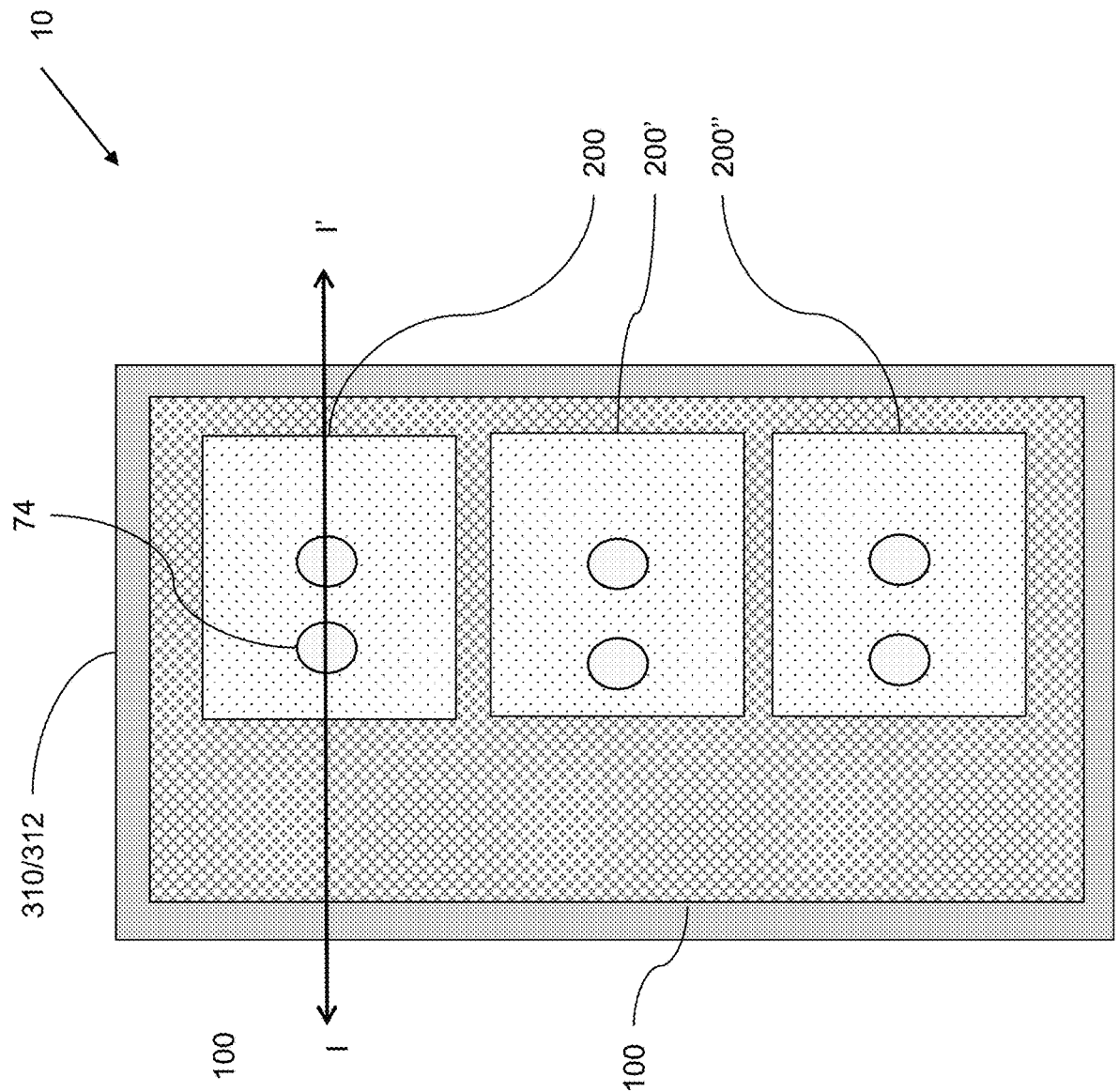
FIG. 4A is simplified top view of a semiconductor package, according to various embodiments of the present disclosure.
Figure 4B:
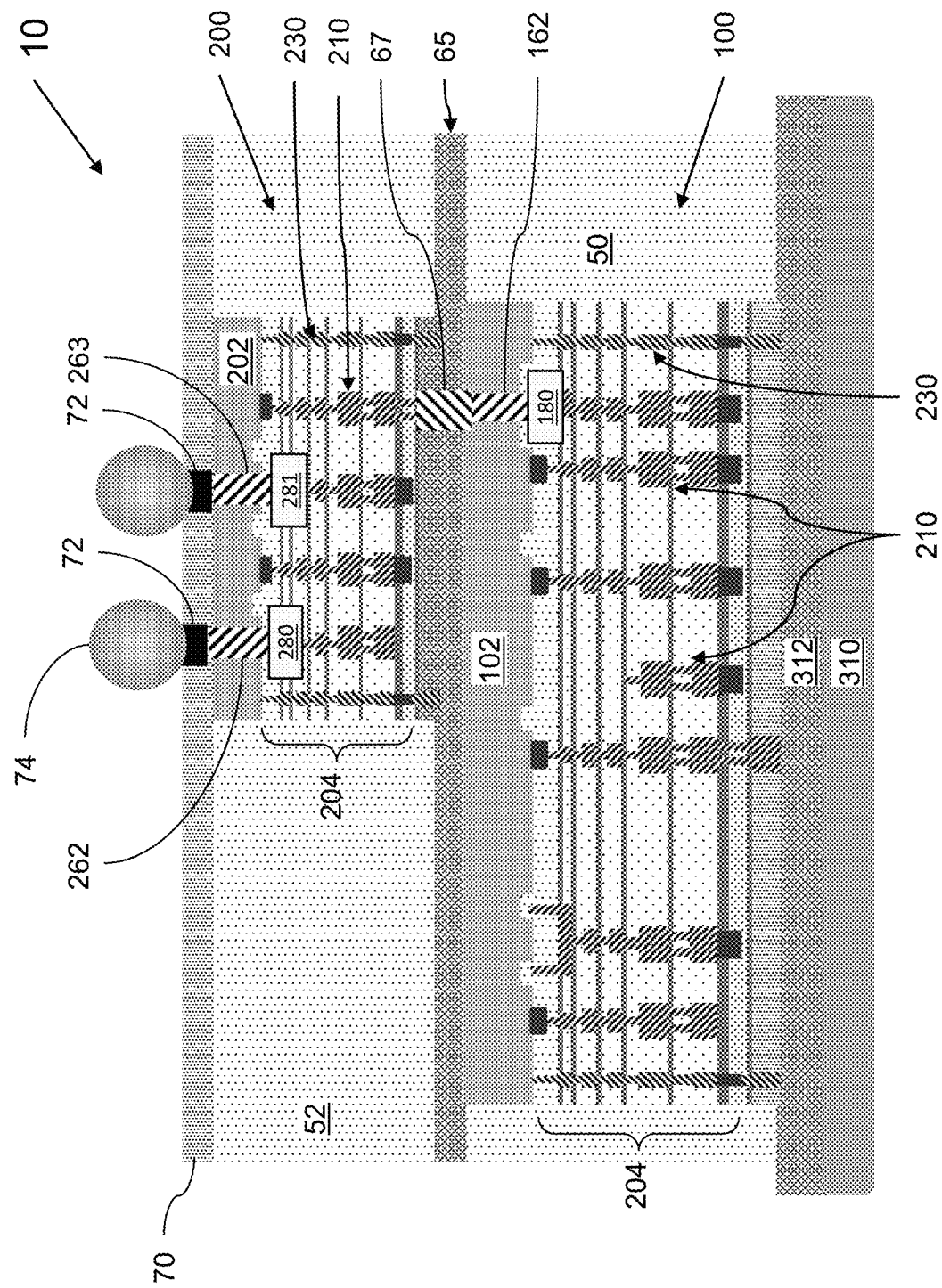
FIG. 4B is a vertical cross-sectional view taken along line I-I' of FIG. 4A.

FIG. 4A is simplified top view of a semiconductor package 10, according to various embodiments of the present disclosure. FIG. 4B is a cross-sectional view taken along line I-I' of FIG. 4A. Referring to FIGS. 4A and 4B, the semiconductor package 10 may include at least one second die 200 stacked on the first die 100 of FIGS. 1A and 1B. For example, the semiconductor package 10 may include three second dies 200, 200', 200" stacked on the first die 100. For convenience, only one second die 200 is described in detail below with respect to the cross sectional view of FIG. 4B.

The second die 200 may be disposed over and bonded to the first die 100. The second die 200 may be an application-specific integrated circuit (ASIC) chip, an analog chip, a sensor chip, a wireless and radio frequency chip, a voltage regulator chip or a memory chip, for example. The second die 200 and the first die 100 may be the same type of dies or different types of dies. In some embodiments, the second die 200 may be an active component or a passive component. In some embodiments, the second die 200 may be smaller than the first die 100.

In some embodiments, the second die 200 is similar to the first die 100. For example, the second die 200 may include a second semiconductor substrate 202, a second dielectric structure 204, a second interconnect structure 210, a second seal ring 230, a second TSV structure 262, and a second fuse structure 280. In some embodiments, the second die 200 may also include a third TSV structure 263 and a third fuse structure 281.

The second dielectric structure 204 may be disposed over a first side (e.g., front side) of the second semiconductor substrate 202. The second dielectric structure 204 may have a single-layer or multi-layer structure. For example, the second dielectric structure 204 may include multiple ILD layers.

The second interconnect structure 210 may be formed in the second dielectric structure 204. Specifically, the second interconnect structure 210 may be overlapped with and electrically connected to an integrated circuit region of the second semiconductor substrate 202. In some embodiments, the second interconnect structure 210 includes second metal features, such as metal lines and via structures. The second interconnect structure 210 may electrically connect semiconductor devices formed on the second semiconductor substrate 202.

The second seal ring 230 may be similar to the first seal ring 130. For example, the second seal ring 230 may include copper at an atomic percentage greater than 80%, such as greater than 90% and/or greater than 95%, although greater or lesser percentages of copper may be used. The second seal ring 230 may be disposed over the first side (e.g., front side) of the second semiconductor substrate 202. Specifically, the second seal ring 230 may surround the second interconnect structure 210, may extend through the second dielectric structure 204, and may be electrically insulated from circuit elements of the second semiconductor substrate 202. In some embodiments, the second seal ring 230 may be formed during the formation of the second dielectric structure 204.

The semiconductor package 10 may include a first dielectric encapsulation (DE) layer 50, a second DE layer 52, a first bonding structure 65, and a passivation layer 70. The semiconductor package 10 may be bonded to a carrier 310 by a carrier bonding layer 312.

The first DE layer 50 may surround sidewalls of the first die 100. The second DE layer 52 may surround sidewalls of the second die 200. In some embodiments, the first DE layer 50 and the second DE layer 52 may include a molding compound comprising a resin and a filler. In alternative embodiments, the first DE layer 50 and the second DE layer 52 may include silicon oxide, silicon nitride, or a combination thereof. The first DE layer 50 and the second DE layer 52 may be formed by spin-coating, lamination, deposition processes, or the like.

The bonding structure 65 may be configured to bond the first die 100 and the second die 200. The bonding structure 65 may include one or more layers of a curable bonding material, such as an epoxy resin or the like. At least one die bonding pad 67 may be disposed in the bonding structure 65. The die bonding pad 67 may be configured to electrically connect the first TSV structure 162 to the second interconnect structure 210. In some embodiments, the die bonding pad 67 may be formed of the same type of metals as the first interconnect structure 110 and/or the second interconnect structure 210.

The passivation layer 70 may be disposed on the second DE layer 52 and may cover the second die 200. The passivation layer 70 may be formed of a dielectric material, such as silicon nitride, silicon oxide, or the like. Device bonding pads 72 may be disposed in the passivation layer 70. In some embodiments, the device bonding pads 72 may be under bump metallization (UBM) pads for mounting conductive connectors 74, such as solder balls, metal pillars, micro-bumps or the like. The device bonding pads 72 may include a metal or a metal alloy. The device bonding pads 72 may include aluminum, copper, nickel, an alloy thereof, or the like, for example. Other suitable pad materials may be within the contemplated scope of disclosure.

The second fuse structure 280 may electrically connect the second TSV structure 262 to the second interconnect structure 210. The third fuse structure 281 may electrically connect the third TSV structure 263 to the second interconnect structure 210. The second fuse structure 280 and the third fuse structure 281 may have the same structure and elements as shown in first fuse structure 180.

During assembly, the second die 200 may be flipped (e.g., turned upside down) and mounted onto the first die 100. In particular, a second wafer including a plurality of the second dies 200 may be positioned over a first wafer including a plurality of the first dies 100. In other embodiments, the second wafer may be diced to singulate the second dies 200, and the second dies 200 may be individually placed on the first wafer, over respect first dies 100.

In some embodiments, the first die 100 and the second die 200 may be face-to-back bonded, as shown in FIG. 4B. In other embodiments, the first die 100 and the second die 200 may be face-to-face bonded. In some embodiments, the first die 100 and the second die 200 may be aligned using an optical sensing method. After the alignment is achieved, a hybrid bonding process that includes a metal-to-metal bonding and a dielectric-to-dielectric bonding may be used to bond the first die 100 and the second die 200. In various embodiments, a dicing process may be performed to singulate the three-dimensional device structure 10.

In some embodiments, a relatively high voltage may be applied to the first fuse structure 180 to open the first fuse structure 180 and electrically disconnect the first die 100 and the second die 200. For example, if the second die 200 is determined to be defective, the second die 200 may be electrically disconnected from the first die 100.

The second fuse structure 280 may be used to respectively electrically disconnect the second TSV structure 262 from the second interconnect structure 210. The third fuse structure 281 may be used to electrically disconnect the third TSV structure 263 from the second interconnect structure 210. For example, if the second TSV structure 262 is determined to be defective, the second fuse structure may be opened to electrically disconnect the second TSV structure 262 from the second interconnect structure 210, and the third TSV structure 263 may be used to electrically connect the second die 200 to an external device.

Various embodiments provide a first die 100 that may include: a first semiconductor substrate 102; a first interconnect structure 110 disposed on a front side of the first semiconductor substrate 102; a first through-substrate via (TSV) structure 162 extending through the first semiconductor substrate 102; and a first fuse structure 180 disposed between and electrically connecting the first TSV structure 162 and the first interconnect structure 110.

In one embodiment, the first fuse structure 180 may include: a contact structure 186 electrically connected to the first interconnect structure 110; and a resistance control layer 182 having a first surface that contacts the first TSV structure 162 and an opposing second surface that contacts the contact structure 186. In one embodiment, an interface between the first TSV structure 162 and the first surface of the resistance control layer 182 has a first surface area; an interface between the contact structure 186 and the second surface of the resistance control layer 182 has a second surface area; and the first surface area is greater than the second surface area. In one embodiment, the first surface area may be at least ten times greater than the second surface area. In one embodiment, the resistance control layer 182 may have a higher electrical resistance than at least one of the first interconnect structure 110 and the first TSV structure 162. In one embodiment, the first interconnect structure 110 may include copper, a copper alloy, aluminum, an aluminum alloy, silver, or a combination thereof; the first TSV structure 162 may include copper, a copper alloy, aluminum, an aluminum alloy, silver, or a combination thereof; and the resistance control layer 182 may include silicon-germanium, tungsten, titanium nitride, tantalum nitride, or a combination thereof. In one embodiment, the first interconnect structure 110 and the first TSV structure 162 may include at least 90% Cu; and the resistance control layer 182 may include silicon germanium, tungsten, titanium nitride, tantalum nitride, or a combination thereof. In one embodiment, the contact structure 186 comprises at least one pillar that extends between a metal line of the first interconnect structure 110 and the resistance control layer 182. In one embodiment, the first fuse structure 180 further includes a contact etch stop layer (CESL) 184 disposed on the second surface of the resistance control layer 182. In one embodiment, the CESL 184 may include a single layer or multiple layers of an etch-stop material comprising silicon nitride, silicon carbide, silicon carbon nitride, a combination thereof. In one embodiment, the first fuse structure 180 may further include a barrier layer 190 disposed between the first TSV structure 162 and the first semiconductor substrate 102. In one embodiment, the first die may further include a first dielectric structure 104 comprising a substrate oxide layer 104A disposed directly on the front side of the first semiconductor substrate 102 and inter-layer dielectric (ILD) layers 104B-104F disposed on the substrate oxide layer 104A, wherein: the first interconnect structure 110 is embedded in the ILD layers 104B-104F; and the first fuse structure 180 may be embedded in the substrate oxide layer 104A, between the first TSV structure 162 and the first interconnect structure 110.

Various embodiments provide a semiconductor package that may include a first die 100, where the first die 100 may include: a first semiconductor substrate 102; a first dielectric structure 104 comprising a substrate oxide layer 104A disposed directly on a front side of the first semiconductor substrate 102 and inter-layer dielectric (ILD) layers 104B-104F disposed on the substrate oxide layer 104A; a first interconnect structure 110 embedded in the first dielectric structure 104; a first through-substrate via (TSV) structure 162 extending through the first semiconductor substrate 102; and a first fuse structure 180 embedded in the substrate oxide layer 104F and electrically connecting the first TSV structure 162 to the first interconnect structure 110.

In one embodiment, the first fuse structure 180 may include: a contact structure 186 electrically connected to the first interconnect structure 110; and a resistance control layer 182 having a first surface that contacts the first TSV structure 162 and an opposing second surface that contacts the contact structure 186. In one embodiment, an interface between the first TSV structure 162 and the first surface of the resistance control layer 182 has a first surface area; an interface between the contact structure 186 and the second surface of the resistance control layer 182 has a second surface area; and the first surface area may be at least ten times greater than the second surface area. In one embodiment, the resistance control layer 182 may have a higher electrical resistance than at least one of the first interconnect structure 110 and the first TSV structure 162.

Various embodiments further provide a method of forming a back side through-silicon via structure, the method comprising: forming a trench 164 in a back side of a first semiconductor substrate 102, such that the trench exposes a first fuse structure 180 disposed in a substrate oxide layer 104A formed on a front side of the first semiconductor substrate 102; depositing a barrier material 190M on the back side of the first semiconductor substrate 102 and in the trench 164; performing an etch-back process to remove the barrier material 190M from a bottom of the trench 164 and form a barrier layer 190 covering sidewalls of the trench 164; depositing a seed layer 162S in the trench 164; and forming a TSV metal layer 162M on the seed layer 162S to form a TSV structure 162 in the trench 164.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a back side through-silicon via (TSV) structure, the method comprising:
    forming a trench in a back side of a first semiconductor substrate, such that the trench exposes a fuse structure disposed in a substrate oxide layer formed on a front side of the first semiconductor substrate;
    depositing a barrier material on a back side of the first semiconductor substrate and in the trench;
    performing an etch-back process to remove the barrier material from a bottom of the trench and form a barrier layer covering sidewalls of the trench;
    forming a seed layer in the trench; and
    forming a TSV structure in the trench and on the seed layer.

2. The method of claim 1, wherein the etch-back process further comprises removing the barrier material from the back side of the first semiconductor substrate.

3. The method of claim 1, wherein the etch-back process further comprises removing any remaining substrate oxide layer from the trench.

4. The method of claim 1, further comprising, prior to forming the trench:
    depositing a protection layer on the back side of the first semiconductor substrate;
    depositing an encapsulation layer on the protection layer; and
    forming a patterned photoresist layer on the encapsulation layer.

5. The method of claim 4, wherein the forming of the trench comprises etching the encapsulation layer, the protection layer, and the first semiconductor layer, using the patterned photoresist layer as a mask.

6. The method of claim 1, wherein the barrier material comprises tantalum (Ta), tantalum nitride (TaN), titanium (Ti), titanium nitride (TiN), cobalt-tungsten (CoW), or a combination thereof.

7. The method of claim 1, wherein the metal layer comprises copper (Cu), a copper alloy, aluminum (Al), an aluminum alloy, silver (Ag), or a combination thereof.

8. The method of claim 1, wherein the seed layer comprises titanium (Ti), titanium nitride (TiN), copper (Cu), a copper alloy, or a combination thereof.

9. The method of claim 1, wherein the forming of the trench comprises exposing a resistance control layer of the fuse structure.

10. The method of claim 9, wherein the resistance control layer comprises silicon-germanium (SiGe), tungsten (W), titanium nitride (TiN), tantalum nitride (TaN), or a combination thereof.

11. A method of forming a back side through-silicon via (TSV) structure, the method comprising:
    forming a trench in a back side of a first semiconductor substrate, such that a fuse structure disposed in a substrate oxide layer formed on a front side of the first semiconductor substrate is exposed at a bottom of the trench;
    forming a barrier layer that covers sidewalls of the trench;
    forming a seed layer that covers the barrier layer and the fuse structure; and
    forming a TSV structure on the seed layer and within the trench.

12. The method of claim 11, further comprising, prior to forming the trench:
    depositing a protection layer on the back side of the first semiconductor substrate;
    depositing an encapsulation layer on the protection layer; and
    forming a patterned photoresist layer on the encapsulation layer.

13. The method of claim 12, wherein the forming of the trench comprises etching the encapsulation layer, the protection layer, and the first semiconductor layer, using the patterned photoresist layer as a mask.

14. The method of claim 13, wherein the forming of the barrier layer comprises:
    depositing a barrier material on the encapsulation layer and in the trench; and
    performing an etch-back process to remove a barrier material from a top surface of the encapsulation layer and from the fuse structure to form the barrier layer.

15. The method of claim 12, wherein:
    the forming of the trench comprises exposing a resistance control layer of the fuse structure; and
    the resistance control layer comprises silicon-germanium (SiGe), tungsten (W), titanium nitride (TiN), tantalum nitride (TaN), or a combination thereof.

16. The method of claim 11, wherein the forming of the seed layer comprises depositing the seed layer on the encapsulation layer, the barrier layer, and the fuse structure.

17. The method of claim 16, wherein the forming of the TSV structure comprises:
   growing a TSV material layer on the seed layer; and
   performing a planarization process to remove TSV material layer and the seed layer from the top surface of the encapsulation layer.

18. The method of claim 17, wherein:
   the barrier material comprises tantalum (Ta), tantalum nitride (TaN), titanium (Ti), titanium nitride (TiN), cobalt-tungsten (CoW), or a combination thereof;
   the TSV material comprises copper (Cu), a copper alloy, aluminum (Al), an aluminum alloy, silver (Ag), or a combination thereof; and
   the seed layer comprises titanium (Ti), titanium nitride (TiN), copper (Cu), a copper alloy, or a combination thereof.

19. A method of forming a back side through-silicon via (TSV) structure on a die comprising a semiconductor substrate, a fuse structure disposed in an oxide layer formed on a front side of the semiconductor substrate, the method comprising:
   forming a protective layer and a dielectric layer on a back side of the semiconductor substrate;
   forming a trench in the back side of a semiconductor substrate, such that the trench extends through the dielectric layer, the protective layer, and the semiconductor substrate to expose a resistance control layer of the fuse structure;
   forming a barrier layer that covers sidewalls of the trench;
   forming a seed layer that covers the barrier layer and the resistance control layer; and
   forming a TSV structure on the seed layer and within the trench.

20. The method of claim 19, wherein fuse structure electrically connects the TSV structure to an interconnect structure formed on the oxide layer.

* * * * *